United States Patent [19]

Kata et al.

[11] Patent Number: 5,283,210
[45] Date of Patent: Feb. 1, 1994

[54] LOW TEMPERATURE SINTERING LOW DIELECTRIC INORGANIC COMPOSITION

[75] Inventors: Keiichiro Kata; Yuzo Shimada, both of Tokyo, Japan

[73] Assignee: NEC Corporation, Tokyo, Japan

[21] Appl. No.: 905,376

[22] Filed: Jun. 29, 1992

[30] Foreign Application Priority Data

Jul. 31, 1991 [JP] Japan ................... 3-213078

[51] Int. Cl.$^5$ .................. C03C 14/00; C03C 4/16
[52] U.S. Cl. ..................... 501/32; 501/23; 501/61
[58] Field of Search ................ 501/17, 23, 32, 61

[56] References Cited

U.S. PATENT DOCUMENTS

| | | | |
|---|---|---|---|
| 4,547,625 | 10/1985 | Tosaki et al. | 501/61 X |
| 4,624,934 | 11/1986 | Kokubu et al. | |
| 4,655,864 | 4/1987 | Rellick | 501/61 X |
| 4,755,490 | 7/1988 | DiLazzaro | |
| 4,764,233 | 8/1988 | Ogihara et al. | 501/61 X |
| 4,849,379 | 7/1989 | McCormick | |
| 4,849,380 | 7/1989 | Sawhill | |
| 4,939,021 | 7/1990 | Aoki et al. | 501/32 X |
| 5,024,975 | 6/1991 | Hartmann | 501/32 X |
| 5,068,210 | 11/1991 | DiLazzaro et al. | 501/32 |
| 5,206,190 | 4/1993 | Jean et al. | 501/32 |

FOREIGN PATENT DOCUMENTS

| | | |
|---|---|---|
| 0445968 | 11/1991 | European Pat. Off. |
| 3-141153 | 6/1991 | Japan |
| 3-252353 | 11/1991 | Japan |
| 3-252354 | 11/1991 | Japan |

OTHER PUBLICATIONS

Kata, et al., "Low Dielectric Constant New Materials for Multilayer Ceramic Substrate", vol. 13, No. 2, pp. 448-451 (Jun. 1990).

Chemical Abstracts. 178538t, "Electric Insulating Paste for Ceramic-Glass Substrates for Multilayer Interconnections", vol. 108 (1988).

*Primary Examiner*—Karl Group
*Attorney, Agent, or Firm*—Burns, Doane, Swecker & Mathis

[57] ABSTRACT

A low temperature sintering, low dielectric inorganic composition is a ternary inorganic composition comprising cordierite, quartz glass and lead borosilicate glass, wherein if the amounts of the cordierite, quartz glass and lead borosilicate glass are represented by X, Y and Z (wt %) respectively, the composition of the ternary system falls within the range encircled by the following four points (a) to (d) including the lines between each neighboring two points:

| | |
|---|---|
| (X=35; Y=0; Z=65) | (a) |
| (X=65; Y=0; Z=35) | (b) |
| (X=0; Y=65; Z=35) | (c) |
| (X=0; Y=35; Z=65) | (d) |

The inorganic composition has a dielectric constant substantially lower than that of the conventional composition while maintaining high reliability such as an ability of being sintered at a low temperature, high insulation properties and high resistance to water as well as excellent mechanical properties such as strength. The composition can be used for producing multilayer ceramic wiring boards for mounting very high speed VLSI elements and contributes to an increase in the packaging density and the production of fast transmitting devices.

13 Claims, 2 Drawing Sheets

FIG. I

LOW TEMPERATURE SINTERING LOW DIELECTRIC INORGANIC COMPOSITION

BACKGROUND OF THE INVENTION

1. Field of the Invention

The present invention relates to an inorganic composition capable of being sintered at a low temperature and having a low dielectric constant and more specifically to an inorganic composition which is mainly used for preparing a multilayer ceramic printed wiring board for mounting a very fast VLSI element, capable of being sintered at a low temperature of the order of not more than 1,000° C. and has a low dielectric constant and high strength.

2. Description of the Prior Art

Until now, semiconductor elements such as IC's and LSI's have been mounted on a printed wiring board of, for instance, a glass-epoxy or an alumina ceramic substrate, but there have been increasingly required for the development of a substrate for mounting these elements which carries a fine pattern of distributing wire in a high density and which is capable of rapid transmission of signals, capable of being operated at a high frequency and capable of rapid radiation of heat as semiconductor elements have been improved in that the degree of integration thereof is increased, that they are more and more miniaturized and that they can operate at a higher speed. However, the conventional printed wiring boards suffer from various problems of insufficient plating ability of through holes, insufficient working characteristics, low adhesion during lamination and high heat deformation at a high temperature, and the conventional printed boards are correspondingly limited in the density of distributing wire patterns to be printed. For this reason, any printed wiring board carrying a fine distributing wire pattern of a desired density has not yet been put into practical use and, therefore, ceramic substrates have attracted much attention recently.

However, the alumina substrates must be sintered at a high temperature of not less than 1500° C. and accordingly, the conductive materials usable for printing distributing wire patterns which are co-fired are limited to a refractory or high-melting metal having relatively high resistivity such as W, Mo or the like. Thus, the degree of fineness of the wiring pattern is limited while taking into consideration the transmission loss of pulse signals.

Under such circumstances, there have been proposed low temperature sintering multilayer ceramic substrates. Examples of insulating ceramic materials in such substrates include those comprising composites of alumina and glass and those comprising crystallized glass. For instance, Japanese Unexamined Patent Publication (hereinafter referred to as "J. P. KOKAI") No. Hei 3-252353 (which corresponds to a pending U.S. Ser. No. 07/661,606 filed on Feb. 28, 1991) discloses a ternary system comprising alumina, quartz glass and borosilicate glass; and J. P. KOKAI Nos. Hei 3-252354 and Hei 3-141153 disclose ternary systems comprising quartz (α-quartz), quartz glass and borosilicate glass or lead borosilicate glass. All of these ceramic materials are sintered at a temperature of not more than 1,000 ° C. and accordingly, a low-melting metal having low resistivity such as Au, Ag-Pd, Cu or the like can be used as a conductive material for printing distributing wire patterns. Moreover, it is also possible to use the green sheet lamination technology which is very effective for obtaining substrates carrying fine distributing wire patterns of high densities.

On the other hand, it is inevitable that the dielectric constants of materials for substrates must be reduced to a level as low as possible to speed up the transmission of signals since the transmission delay time of pulse signals is proportional to the root of the dielectric constant of a particular substrate material selected. For instance, the dielectric constant of alumina is about 10 and those of low temperature sintering ceramic substrates are lower than that of alumina. However, the reduction of dielectric constants of substrate materials is still insufficient for achieving high transmission velocity of signals. There has thus been investigated the use of those having low dielectric constants which comprise, as host ceramics, quartz glass and other materials having low dielectric constants such as cordierite and mullite in place of alumina and the use of glass components having low dielectric constants such as those mainly comprising silicon oxide or boron oxide. These materials have sufficiently low dielectric constants, but suffer from problems of lowering of mechanical properties such as strength. This problem becomes more conspicuous in producing substrates and in mounting semiconductor elements.

SUMMARY OF THE INVENTION

Accordingly, an object of the present invention is generally to solve the foregoing problems associated with the conventional techniques and more specifically to provide an inorganic composition for forming insulating layers of multilayer ceramic substrates for high density-mounting, which has a low dielectric constant and high strength and can be sintered at a low temperature of not more than 1,000° C.

According to the present invention, the foregoing object can effectively be accomplished by providing an inorganic composition capable of being sintered at a low temperature and having a low dielectric constant (hereinafter referred to as "a low temperature sintering, low dielectric inorganic composition") which is a ternary inorganic composition comprising cordierite, quartz glass and lead borosilicate glass as a ceramic material wherein if the amounts of the cordierite, quartz glass and lead borosilicate glass are represented by X, Y and Z (% by weight) respectively, the composition of the ternary system falls within the range encircled by the following four points (a) to (d) including the lines between each neighbouring two points:

| | |
|---|---|
| (X=35; Y=0; Z=65) | (a) |
| (X=65; Y=0; Z=35) | (b) |
| (X=0; Y=65; Z=35) | (c) |
| (X=0; Y=35; Z=65) | (d) |

DESCRIPTION OF THE PREFERRED EMBODIMENTS

Figure 1:
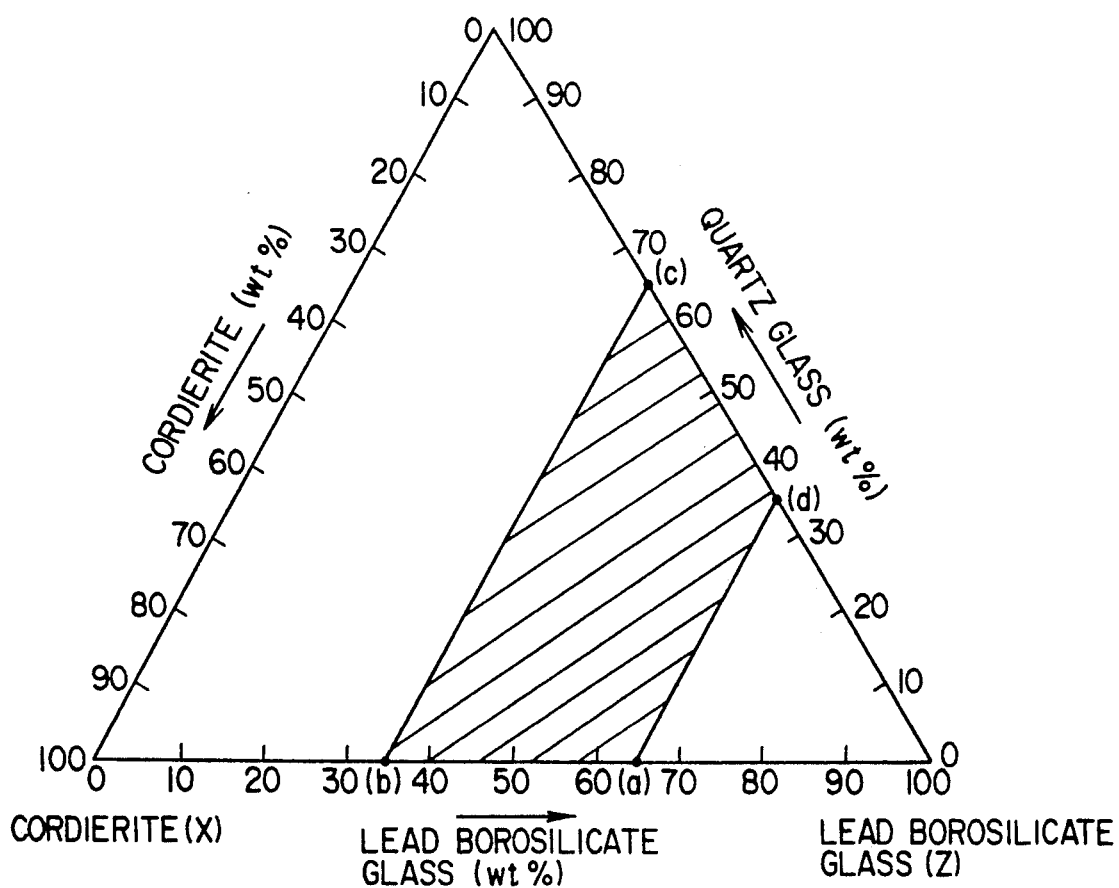
FIG. 1 is a compositional diagram showing the desired range of the composition of the ternary system according to the present invention.

The low temperature sintering, low dielectric inorganic composition according to the present invention will hereinafter be explained in more detail.

In the inorganic composition, the lead borosilicate glass preferably comprises as a principal component 50 to 75% by weight of silicon oxide, 1 to 30% by weight of boron oxide, 1 to 30% by weight of lead oxide, 0.1 to 5% by weight of oxides of Group I elements, 0.1 to 15% by weight of oxides of Group II elements, 0.1 to 1% by weight of titanium oxide and 0.1 to 1% by weight of zirconium oxide, provided that these components are selected so that the sum of the amounts of these components is equal to 100% by weight, if the components are expressed in terms of reduced amounts of oxides thereof.

The low temperature sintering, low dielectric inorganic composition of the present invention can be prepared by using, for instance, the following materials and methods. First, the lead borosilicate glass can be prepared by weighing out the desired ingredients to give a batch having a desired composition and melting these ingredients through heating at a high temperature of the order of not less than 1,400° C. for 2 to 4 hours to thus convert them into a molten glass. The molten glass is then watercooled or poured on a thick iron plate to form it into flakes, the resulting glass flakes or pieces are finely milled in, for instance, an alumina ball mill to give glass powder having an average particle size ranging from 0.5 to 3 $\mu$m. Separately, cordierite and quartz glass are likewise milled into fine particles having an average particle size ranging from 0.5 to 5 $\mu$m.

The powdered ingredients are appropriately mixed to give a mixture having a desired composition and milled and mixed in, for instance, a ball mill for 1 to 3 hours to give a uniform powdery mixture of these lead borosilicate glass, cordierite and quartz glass powders for a low temperature sintering, low dielectric inorganic composition of the present invention. In the foregoing, the composition of lead borosilicate glass is defined by the amounts of reduced oxides of the ingredients for the sake of clarification, but it may be used in the form of minerals, oxides, carbonates, hydroxides or the like in the usual manner. In the composition of lead borosilicate glass, Group I elements include all the elements of Group I of a periodic table, preferably Na and K, and Group II elements include all the elements of Group II of a periodic table, preferably Mg, Ca, Ba, Sr and Zn.

Upon practical use of the powdery inorganic composition of the present invention obtained in the foregoing manner, it is formed into a desired shape by, for instance, the green sheet lamination technology. More specifically, a vehicle is added to the powder, the mixture is sufficiently kneaded and uniformly dispersed using a high-speed mixer or a ball mill to give a slurry and then the slurry is formed into a green sheet having a thickness suitable for forming an insulating layer through the slip-casting method. The organic vehicles such as binders and solvents are not restricted to specific ones and those commonly used in this field can be employed without any trouble.

Then through holes are formed in the sheet for electrically connecting upper and lower conductive substances to be applied, a conductive paste is applied thereto to form a printed pattern so that the through holes are filled with the paste to thus ensure the foregoing electrical connection, then the green sheets thus obtained are laminated and heat-welded to give an assembly for substrate having a desired multilayer structure. Thereafter, the assembly is heated to remove the organic vehicle added during molding and then fired to finally give a multilayer ceramic printed wiring board.

As has been described above, the low temperature sintering, low dielectric inorganic composition of the present invention comprises lead borosilicate glass, cordierite and quartz glass and must have a specific composition as defined above. Further, the lead borosilicate glass preferably has the foregoing composition. The reasons therefor will be detailed below.

FIG. 1 shows the desired range of the composition of the ternary system of the present invention. As seen from FIG. 1, the composition of the ternary system must fall within the range encircled by the four points (a) to (d) including the lines between each neighbouring two points, which correspond to the shadowed area in the figure.

If in the figure the amount of the lead borosilicate glass Z is less than 35% by weight, the resulting inorganic composition cannot be sintered at a low temperature of not more than 1,000° C. and cannot be formed into compact layers. This leads to water absorption and hence the formation of layers having low reliability. On the other hand, if it exceeds 65% by weight, the resulting composition causes foaming, deformation and warp when it is fired at a temperature of not less than 800° C. This results in the reduction of the insulation resistance and strength of the resulting substrate.

Referring now to the composition of the lead borosilicate glass which is one of the principal ingredients of the low temperature sintering, low dielectric inorganic composition of the present invention, both silicon oxide and boron oxide are glass network-formers. Therefore, if the amount of silicon oxide exceeds 75% by weight, the resulting glass has a high softening point. Thus, it is difficult to perform low temperature sintering unless the rate of glass is increased. However, the increase in the rate of glass results in the reduction of the mechanical strength. On the other hand, if it is less than 50% by weight, the softening point of the resulting glass is too low and this leads to foaming, deformation and warp during firing at a temperature of not less than 800° C.

Further, if the amount of boron oxide exceeds 30% by weight, the softening point of the glass is rapidly decreased and deformation and warp are liable to cause during a heat treatment. On the other hand, the use thereof in a small amount is required for the improvement of durability and heat resistance of the glass and for ensuring the stability of the glass such as prevention of devitrification. The addition of lead oxide leads to an increase in the dielectric constant of the resulting glass, but simultaneously accompanies a decrease in the softening point and an increase in the density. Thus, the use of lead oxide is preferred for the improvement of firing properties and strength of the glass. The optimum effect can be ensured when the amount thereof is restricted to the range of from 1 to 30% by weight while taking into consideration the stability of the glass.

Other components are added in small amounts to control the solubility and stability of the glass. This is because the use thereof in excess leads to an increase in the dielectric constant and coefficient of thermal expansion. As has been explained above in detail, the amounts of silicon oxide, boron oxide and lead oxide components present in the lead borosilicate glass are likewise quite important factors in the present invention.

The present invention will hereinafter be explained in more detail with reference to the following non-limitative working Examples and the effects practically accomplished by the present invention will also be discussed in detail in comparison with the following Comparative Examples. In the following Examples, the term "%" means "% by weight" unless otherwise specified.

EXAMPLES 1 TO 15 AND COMPARATIVE EXAMPLES 1 TO 6

Glass powders each having a composition listed in column (I) of Table 1 were prepared and subjected to wet milling for 48 hours together with an alcohol as a dispersant. The resulting glass powders were then subjected to sizing with a sieve, followed by the removal of the alcohol through filtration and drying to give powders of lead borosilicate glass having an average particle size of 2.0 $\mu$m and a BET specific surface area of 6 $m^2/g$.

Each of these lead borosilicate glass powders (Z) was mixed with cordierite powder (X) having an average particle size of 2.6 $\mu$m and a BET specific surface area of 5 $m^2/g$ and quartz glass powder (Y) having an average particle size of 3.7 $\mu$m and a BET specific surface area of 6 $m^2/g$ in proportions as listed in Table 2. The mixing of these ingredients was performed by weighing predetermined amounts of these powders, mixing them for 3 hours in a ball mill using an alcohol as a dispersant, removing the alcohol through filtration and drying to give uniformly mixed powders.

The evaluation of various properties of the resulting inorganic compositions were performed using samples obtained by cutting, into small sheets, green laminated bodies free of printed pattern produced through the green sheet lamination technology, then removing the organic vehicle through heating the sheets in an electric furnace and then firing. In this connection, the optimum firing temperature for the samples of the present invention is determined to be a temperature at which the void volume of the fired product is not more than 5% and which is observed when they are fired at a temperature ranging from 800° to 1,000° C. in the air. The properties herein evaluated were (i) dielectric constant, (ii) insulation resistance, (iii) bending strength, (iv) deformation—warp. The dielectric constant was determined at a frequency of 1 MHz. Electrodes were formed by applying a conductive silver paste onto upper and lower faces of each sample and then baking the coated paste at 600° C. The insulation resistance was determined at an applied voltage of 100 V. The bending strength was determined by the three-point bending test at intervals of 10 mm.

The proportions of the cordierite, quartz glass and lead borosilicate glass, as well as the dielectric constants, insulation resistances, bending strengths and the presence of deformation—warp thus observed are summarized in Table 2. In Table 2, X, Y and Z represent cordierite, quartz glass, and lead borosilicate glass respectively. The same applies to the following Tables 3 to 6.

As seen from the data listed in Table 2, the ternary inorganic compositions whose compositions fall within the range defined by the invention (Examples 1 to 15) had sufficiently low dielectric constants ranging from 4.32 to 5.62 and were highly insulated since they had high insulation resistances of not less than $10^{13}$ $\Omega$·cm.

This clearly means that there was not observed any foaming and the remainder of open pores due to insufficient sintering. Moreover, the bending strengths of the conventional low dielectric ceramic materials were in the order of 1,000 $kg/cm^2$, but those of the compositions according to the present invention were 1350 $kg/cm^2$ or higher with the maximum thereof being 2350 $km/cm^2$. Further, there was not observed any deformation due to excess reduction of the softening point and the warp observed was at highest 200 $\mu$m.

On the other hand, the ceramic compositions of Comparative Examples 1 to 3 whose compositions are outside the foregoing range of the present invention caused foaming due to a high degree of sintering. The resulting sintered products had low dielectric constants, but the insulation properties thereof were impaired. Moreover, they caused deformation—warp and thus were not practically acceptable. The compositions of Comparative Examples 4 to 6 were not sintered at a low temperature of not more than 1,000° C. and accordingly the insulating properties and the strength thereof were likewise lowered because of the low contents

TABLE 1

| Component | Compositional Ratio (wt. %) | | | | |
| --- | --- | --- | --- | --- | --- |
| | (I) | (II) | (III) | (IV) | (V) |
| $SiO_2$ | 68.9 | 66.7 | 64.9 | 58.7 | 51.4 |
| $B_2O_3$ | 13.4 | 11.8 | 6.8 | 15.2 | 9.2 |
| PbO | 1.5 | 8.9 | 16.6 | 22.3 | 28.7 |
| $Na_2O$ | 1.37 | 1.87 | 2.40 | 1.02 | 0.38 |
| $K_2O$ | 2.17 | 1.89 | 2.17 | 1.23 | 0.43 |
| MgO | 6.00 | 3.25 | 0.41 | 0.23 | 4.89 |
| CaO | 5.37 | 4.23 | 5.37 | 0.40 | 3.22 |
| BaO | 0.21 | 0.30 | 0.21 | 0.21 | 0.40 |
| $TiO_2$ | 0.17 | 0.19 | 0.21 | 0.22 | 0.75 |
| $ZrO_2$ | 0.91 | 0.87 | 0.93 | 0.49 | 0.63 |

TABLE 2

| | | Compositional Ratio of Components (wt %) | | | Dielectric Constant | Insulation Resistance ($\Omega$·cm) | Bending Strength ($kg/cm^2$) | Presence of Deformation - Warp |
| --- | --- | --- | --- | --- | --- | --- | --- | --- |
| | No. | X | Y | Z | | | | |
| Comp. Ex. | | | | | | | | |
| 1 | 1 | 30 | 0 | 70 | 4.93 | >$10^{11}$ | 1250 | Present |
| 2 | 2 | 15 | 15 | 70 | 4.73 | >$10^{11}$ | 1100 | " |
| 3 | 3 | 0 | 30 | 70 | 4.51 | >$10^{11}$ | 1050 | " |
| Ex. | | | | | | | | |
| 1 | 4 | 35 | 0 | 65 | 5.08 | >$10^{13}$ | 1900 | Absent |
| 2 | 5 | 25 | 10 | 65 | 4.85 | >$10^{13}$ | 1850 | " |
| 3 | 6 | 10 | 25 | 65 | 4.62 | >$10^{13}$ | 1550 | " |
| 4 | 7 | 0 | 35 | 65 | 4.47 | >$10^{13}$ | 1450 | " |
| 5 | 8 | 45 | 0 | 55 | 5.31 | >$10^{13}$ | 2150 | " |
| 6 | 9 | 0 | 45 | 55 | 4.47 | >$10^{13}$ | 1500 | " |
| 7 | 10 | 30 | 20 | 50 | 4.98 | >$10^{13}$ | 1650 | " |
| 8 | 11 | 15 | 35 | 50 | 4.85 | >$10^{13}$ | 1550 | " |
| 9 | 12 | 55 | 0 | 45 | 5.43 | >$10^{13}$ | 2200 | " |
| 10 | 13 | 0 | 55 | 45 | 4.32 | >$10^{13}$ | 1400 | " |
| 11 | 14 | 65 | 0 | 35 | 5.62 | >$10^{13}$ | 2350 | " |
| 12 | 15 | 50 | 15 | 35 | 5.38 | >$10^{13}$ | 1950 | " |
| 13 | 16 | 30 | 35 | 35 | 5.01 | >$10^{13}$ | 1700 | " |
| 14 | 17 | 15 | 50 | 35 | 4.92 | >$10^{13}$ | 1450 | " |
| 15 | 18 | 0 | 65 | 35 | 4.39 | >$10^{13}$ | 1350 | " |
| Comp. Ex. | | | | | | | | |
| 4 | 19 | 70 | 0 | 30 | 5.08 | >$10^9$ | 1250 | Absent |
| 5 | 20 | 30 | 40 | 30 | 4.83 | >$10^9$ | 1050 | " |
| 6 | 21 | 0 | 70 | 30 | 4.12 | >$10^9$ | 900 | " |

EXAMPLES 16 TO 30 AND COMPARATIVE EXAMPLES 7 TO 12

Lead borosilicate glass powders each having a composition as listed in column (II) of Table 1 were treated so as to control the average particle size to 1.9 μm and the BET specific surface area to 7 m²/g. Test samples were prepared from each of these lead borosilicate glass powders, cordierite powder and quartz glass powder in a desired ratio specified in Table 3 and then evaluated for various properties in the same manner used in Examples 1 to 15. The results thus obtained are summarized in Table 3.

As seen from the data listed in Table 3, the ternary inorganic compositions whose compositions fall within the range defined by the invention (Examples 16 to 30) had sufficiently low dielectric constants ranging from 4.37 to 5.87 and were highly insulated since they had high insulation resistances of not less than $10^{13}$ Ω·cm. This clearly means that there was not observed any foaming and the remainder of open pores due to insufficient sintering. Moreover, the bending strength of the compositions according to the present invention were 1300 kg/cm² or higher with the maximum thereof being 2350 kg/cm². Further, there was not observed any deformation due to excess reduction of the softening point and the warp observed was at highest 200 μm.

On the other hand, the ceramic compositions of Comparative Examples 7 to 9 whose compositions are outside the foregoing range of the present invention caused foaming due to a high degree of sintering. The resulting sintered products had low dielectric constants, but the insulation properties thereof were impaired. Moreover, they caused deformation—warp and thus were not practically acceptable. The compositions of Comparative Examples 10 to 12 were not sintered at a low temperature of not more than 1,000° C. and accordingly the insulating properties and the strength thereof were likewise lowered because of the contents of lead borosilicate glass.

TABLE 3

| No. | Compositional Ratio of Components (wt %) X | Y | Z | Dielectric Constant | Insulation Resistance (Ω·cm) | Bending Strength (kg/cm²) | Presence of Deformation - Warp |
|---|---|---|---|---|---|---|---|
| Comp. Ex. | | | | | | | |
| 7 | 1 | 30 | 0 | 70 | 5.10 | >$10^{11}$ | 1200 | Present |
| 8 | 2 | 15 | 15 | 70 | 4.93 | >$10^{11}$ | 1400 | " |
| 9 | 3 | 0 | 30 | 70 | 4.54 | >$10^{11}$ | 1000 | " |
| Ex. | | | | | | | |
| 16 | 4 | 35 | 0 | 65 | 5.21 | >$10^{13}$ | 1900 | Absent |
| 17 | 5 | 25 | 10 | 65 | 4.99 | >$10^{13}$ | 2050 | " |
| 18 | 6 | 10 | 25 | 65 | 4.73 | >$10^{13}$ | 1600 | " |
| 19 | 7 | 0 | 35 | 65 | 4.51 | >$10^{13}$ | 1400 | " |
| 20 | 8 | 45 | 0 | 55 | 5.52 | >$10^{13}$ | 2250 | " |
| 21 | 9 | 0 | 45 | 55 | 4.57 | >$10^{13}$ | 1500 | " |
| 22 | 10 | 30 | 20 | 50 | 5.15 | >$10^{13}$ | 1800 | " |
| 23 | 11 | 15 | 35 | 50 | 5.08 | >$10^{13}$ | 1600 | " |
| 24 | 12 | 55 | 0 | 45 | 5.58 | >$10^{13}$ | 2350 | " |
| 25 | 13 | 0 | 55 | 45 | 4.37 | >$10^{13}$ | 1550 | " |
| 26 | 14 | 65 | 0 | 35 | 5.87 | >$10^{13}$ | 2300 | " |
| 27 | 15 | 50 | 15 | 35 | 5.44 | >$10^{13}$ | 1800 | " |
| 28 | 16 | 30 | 35 | 35 | 4.75 | >$10^{13}$ | 1650 | " |
| 29 | 17 | 15 | 50 | 35 | 4.97 | >$10^{13}$ | 1500 | " |
| 30 | 18 | 0 | 65 | 35 | 4.43 | >$10^{13}$ | 1300 | " |
| Comp. Ex. | | | | | | | |
| 10 | 19 | 70 | 0 | 30 | 4.73 | >$10^9$ | 1100 | Absent |
| 11 | 20 | 30 | 40 | 30 | 4.81 | >$10^9$ | 1200 | " |
| 12 | 21 | 0 | 70 | 30 | 4.31 | >$10^9$ | 850 | " |

Lead borosilicate glass powders each having a composition as listed in column (III) of Table 1 were treated so as to control the average particle size of 1.8 μm and the BET specific surface area to 7 m²/g. Test samples were prepared from each of these lead borosilicate glass powders, cordierite powder and quartz glass powder in a desired ratio specified in Table 4 and then evaluated for various properties in the same manner used in Examples 1 to 15. The results thus obtained are summarized in Table 4.

As seen from the data listed in Table 4, the ternary inorganic compositions whose compositions fall within the range defined by the present invention (Examples 31 to 45) had sufficiently low dielectric constants ranging from 4.31 to 6.02 and were highly insulated since they had high insulation resistances of not less than $10^{13}$ Ω·cm. This clearly means that there was not observed any foaming and the remainder of open pores due to insufficient sintering. Moreover, the bending strength of the compositions according to the present invention were 1350 kg/cm² or higher with the maximum thereof being 2400 kg/cm². Further, there was not observed any deformation due to excess reduction of the softening point and the warp observed was at highest 200 μm.

On the other hand, the ceramic compositions of Comparative Examples 13 to 15 whose compositions are outside the foregoing range of the present invention caused foaming due to a high degree of sintering. The resulting sintered products had low dielectric constants, but the insulation properties thereof were impaired. Moreover, they caused deformation—warp and thus were not practically acceptable. The compositions of Comparative Examples 16 to 18 were not sintered at a low temperature of not more than 1,000° C. and accordingly the insulating properties and the strength thereof were likewise lowered because of the low contents of lead borosilicate glass.

TABLE 4

| No. | Compositional Ratio of Components (wt %) X | Y | Z | Dielectric Constant | Insulation Resistance (Ω·cm) | Bending Strength (kg/cm²) | Presence of Deformation - Warp |
|---|---|---|---|---|---|---|---|
| Comp. Ex. | | | | | | | |
| 13 | 1 | 30 | 0 | 70 | 5.21 | >$10^{11}$ | 1350 | Present |
| 14 | 2 | 15 | 15 | 70 | 4.99 | >$10^{11}$ | 1200 | " |
| 15 | 3 | 0 | 30 | 70 | 4.48 | >$10^{11}$ | 1000 | " |
| Ex. | | | | | | | |
| 31 | 4 | 35 | 0 | 65 | 6.02 | >$10^{13}$ | 1900 | Absent |
| 32 | 5 | 25 | 10 | 65 | 5.83 | >$10^{13}$ | 2000 | " |
| 33 | 6 | 10 | 25 | 65 | 5.89 | >$10^{13}$ | 1750 | " |
| 34 | 7 | 0 | 35 | 65 | 5.72 | >$10^{13}$ | 1700 | " |
| 35 | 8 | 45 | 0 | 55 | 5.49 | >$10^{13}$ | 2200 | " |
| 36 | 9 | 0 | 45 | 55 | 5.55 | >$10^{13}$ | 1500 | " |
| 37 | 10 | 30 | 20 | 50 | 5.30 | >$10^{13}$ | 1950 | " |
| 38 | 11 | 15 | 35 | 50 | 4.93 | >$10^{13}$ | 1500 | " |
| 39 | 12 | 55 | 0 | 45 | 5.62 | >$10^{13}$ | 2350 | " |
| 40 | 13 | 0 | 55 | 45 | 4.31 | >$10^{13}$ | 1550 | " |
| 41 | 14 | 65 | 0 | 35 | 6.00 | >$10^{13}$ | 2400 | " |
| 42 | 15 | 50 | 15 | 35 | 5.63 | >$10^{13}$ | 1650 | " |
| 43 | 16 | 30 | 35 | 35 | 4.82 | >$10^{13}$ | 1700 | " |

TABLE 4-continued

| | Compositional Ratio of Components (wt %) | | | Dielectric Constant | Insulation Resistance ($\Omega \cdot cm$) | Bending Strength ($kg/cm^2$) | Presence of Deformation - Warp |
|---|---|---|---|---|---|---|---|
| No. | X | Y | Z | | | | |
| 44 | 17 | 15 | 50 | 35 | 4.73 | $>10^{13}$ | 1350 | " |
| 45 | 18 | 0 | 65 | 35 | 4.61 | $>10^{13}$ | 1400 | " |
| Comp. Ex. | | | | | | | |
| 16 | 19 | 70 | 0 | 30 | 4.60 | $>10^9$ | 1100 | Absent |
| 17 | 20 | 30 | 40 | 30 | 4.87 | $>10^9$ | 1100 | " |
| 18 | 21 | 0 | 70 | 30 | 4.25 | $>10^9$ | 750 | " |

EXAMPLES 46 TO 60, COMPARATIVE EXAMPLES 19 TO 24

Lead borosilicate glass powders each having a composition as listed in column (IV) of Table 1 were treated so as to control the average particle size to 2.0 μm and the BET specific surface area to 7 m²/g. Test samples were prepared from each of these lead borosilicate glass powders, cordierite powder and quartz glass powder in a desired ratio specified in Table 5 and then evaluated for various properties in the same manner used in Examples 1 to 15. The results thus obtained are summarized in Table 5.

As seen from the data listed in Table 5, the ternary inorganic compositions whose compositions fall within the range defined by the present invention (Examples 46 to 60) had sufficiently low dielectric constants ranging from 4.82 to 6.10 and were highly insulated since they had high insulation resistances of not less than $10^{13}$ $\Omega \cdot cm$. This clearly means that there was not observed any foaming and the remainder of open pores due to insufficient sintering. Moreover, the bending strength of the compositions according to the present invention were 1700 kg/cm² or higher with the maximum thereof being 2650 kg/cm². Further, there was not observed any deformation due to excess reduction of the softening point and the warp observed was at highest 200 μm.

On the other hand, the ceramic compositions of Comparative Examples 19 to 21 whose compositions are outside the foregoing range of the present invention caused foaming due to a high degree of sintering. The resulting sintered products had low dielectric constants, but the insulation properties thereof were impaired. Moreover, they caused deformation—warp and thus were not practically acceptable. The compositions of Comparative Examples 22 to 24 were not sintered at a low temperature of not more than 1,000° C. and accordingly the insulating properties and the strength thereof were likewise lowered because of the low contents of lead borosilicate glass.

TABLE 5

| | Compositional Ratio of Components (wt %) | | | Dielectric Constant | Insulation Resistance ($\Omega \cdot cm$) | Bending Strength ($kg/cm^2$) | Presence of Deformation - Warp |
|---|---|---|---|---|---|---|---|
| No. | X | Y | Z | | | | |
| Comp. Ex. | | | | | | | |
| 19 | 1 | 30 | 0 | 70 | 5.81 | $>10^{11}$ | 1550 | Present |
| 20 | 2 | 15 | 15 | 70 | 5.53 | $>10^{11}$ | 1400 | " |
| 21 | 3 | 0 | 30 | 70 | 5.40 | $>10^{11}$ | 1400 | " |
| Ex. | | | | | | | |
| 46 | 4 | 35 | 0 | 65 | 6.10 | $>10^{13}$ | 2000 | Absent |
| 47 | 5 | 25 | 10 | 65 | 6.03 | $>10^{13}$ | 2000 | " |
| 48 | 6 | 10 | 25 | 65 | 5.97 | $>10^{13}$ | 1850 | " |

TABLE 5-continued

| | Compositional Ratio of Components (wt %) | | | Dielectric Constant | Insulation Resistance ($\Omega \cdot cm$) | Bending Strength ($kg/cm^2$) | Presence of Deformation - Warp |
|---|---|---|---|---|---|---|---|
| No. | X | Y | Z | | | | |
| 49 | 7 | 0 | 35 | 65 | 5.83 | $>10^{13}$ | 1750 | " |
| 50 | 8 | 45 | 0 | 55 | 5.70 | $>10^{13}$ | 1700 | " |
| 51 | 9 | 0 | 45 | 55 | 5.65 | $>10^{13}$ | 2250 | " |
| 52 | 10 | 30 | 20 | 50 | 5.55 | $>10^{13}$ | 2000 | " |
| 53 | 11 | 15 | 35 | 50 | 5.27 | $>10^{13}$ | 1950 | " |
| 54 | 12 | 55 | 0 | 45 | 5.63 | $>10^{13}$ | 2650 | " |
| 55 | 13 | 0 | 55 | 45 | 5.00 | $>10^{13}$ | 2000 | " |
| 56 | 14 | 65 | 0 | 35 | 5.83 | $>10^{13}$ | 2550 | " |
| 57 | 15 | 50 | 15 | 35 | 5.29 | $>10^{13}$ | 2000 | " |
| 58 | 16 | 30 | 35 | 35 | 5.13 | $>10^{13}$ | 1800 | " |
| 59 | 17 | 15 | 50 | 35 | 5.43 | $>10^{13}$ | 1950 | " |
| 60 | 18 | 0 | 65 | 35 | 4.82 | $>10^{13}$ | 1900 | " |
| Comp. Ex. | | | | | | | |
| 22 | 19 | 70 | 0 | 30 | 4.83 | $>10^9$ | 1300 | Absent |
| 23 | 20 | 30 | 40 | 30 | 4.72 | $>10^9$ | 1300 | " |
| 24 | 21 | 0 | 70 | 30 | 4.33 | $>10^9$ | 1000 | " |

EXAMPLES 61 TO 75, COMPARATIVE EXAMPLES 25 TO 30

Lead borosilicate glass powders each having a composition as listed in column (V) of Table 1 were treated so as to control the average particle size to 1.8 μm and the BET specific surface area to 9 m²/g. Test samples were prepared from each of these lead borosilicate glass powders, cordierite powder and quartz glass powder in a desired ratio specified in Table 6 and then evaluated for various properties in the same manner used in Examples 1 to 15. The results thus obtained are summarized in Table 6.

As seen from the data listed in Table 6, the ternary inorganic compositions whose compositions fall within the range defined by the present invention (Examples 61 to 75) had sufficiently low dielectric constants ranging from 4.83 to 6.73 and were highly insulated since they had high insulation resistances of not less than $10^{13}$ $\Omega \cdot cm$. This clearly means that there was not observed any foaming and the remainder of open pores due to insufficient sintering. Moreover, the bending strength of the compositions according to the present invention were 1900 kg/cm² or higher with the maximum thereof being 2850 kg/cm². Further, there was not observed any deformation due to excess reduction of the softening point and the warp observed was at highest 200 μm.

On the other hand, the ceramic compositions of Comparative Examples 25 to 27 whose compositions are outside the foregoing range of the present invention caused foaming due to a high degree of sintering. The resulting sintered products had low dielectric constants, but the insulation properties thereof were impaired. Moreover, they caused deformation—warp and thus were not practically acceptable. The compositions of Comparative Examples 28 to 30 were not sintered at a low temperature of not more than 1,000° C. and accordingly the insulating properties and the strength thereof were likewise lowered because of the low contents of lead borosilicate glass.

TABLE 6

| | Compositional Ratio of Components (wt %) | | | Di-electric Constant | Insulation Resistance (Ω·cm) | Bending Strength (kg/cm²) | Presence of Deformation - Warp |
|---|---|---|---|---|---|---|---|
| No. | X | Y | Z | | | | |
| Comp. Ex. | | | | | | | |
| 25 | 1 | 30 | 0 | 70 | 6.43 | $>10^{11}$ | 1650 | Present |
| 26 | 2 | 15 | 15 | 70 | 6.21 | $>10^{11}$ | 1550 | " |
| 27 | 3 | 0 | 30 | 70 | 6.00 | $>10^{11}$ | 1500 | " |
| Ex. | | | | | | | |
| 61 | 4 | 35 | 0 | 65 | 6.73 | $>10^{13}$ | 2100 | Absent |
| 62 | 5 | 25 | 10 | 65 | 6.52 | $>10^{13}$ | 2000 | " |
| 63 | 6 | 10 | 25 | 65 | 6.31 | $>10^{13}$ | 1900 | " |
| 64 | 7 | 0 | 35 | 65 | 6.41 | $>10^{13}$ | 1950 | " |
| 65 | 8 | 45 | 0 | 55 | 6.23 | $>10^{13}$ | 2500 | " |
| 66 | 9 | 0 | 45 | 55 | 5.74 | $>10^{13}$ | 2200 | " |
| 67 | 10 | 30 | 20 | 50 | 5.73 | $>10^{13}$ | 2100 | " |
| 68 | 11 | 15 | 35 | 50 | 5.51 | $>10^{13}$ | 2200 | " |
| 69 | 12 | 55 | 0 | 45 | 5.81 | $>10^{13}$ | 2850 | " |
| 70 | 13 | 0 | 55 | 45 | 5.23 | $>10^{13}$ | 2000 | " |
| 71 | 14 | 65 | 0 | 35 | 5.45 | $>10^{13}$ | 2600 | " |
| 72 | 15 | 50 | 15 | 35 | 5.31 | $>10^{13}$ | 2500 | " |
| 73 | 16 | 30 | 35 | 35 | 5.08 | $>10^{13}$ | 2400 | " |
| 74 | 17 | 15 | 50 | 35 | 4.95 | $>10^{13}$ | 2400 | " |
| 75 | 18 | 0 | 65 | 35 | 4.83 | $>10^{13}$ | 2200 | " |
| Comp. Ex. | | | | | | | |
| 28 | 19 | 70 | 0 | 30 | 4.61 | $>10^{9}$ | 1500 | Absent |
| 29 | 20 | 30 | 40 | 30 | 4.43 | $>10^{9}$ | 1500 | " |
| 30 | 21 | 0 | 70 | 30 | 4.25 | $>10^{9}$ | 1100 | " |

Figure 2:
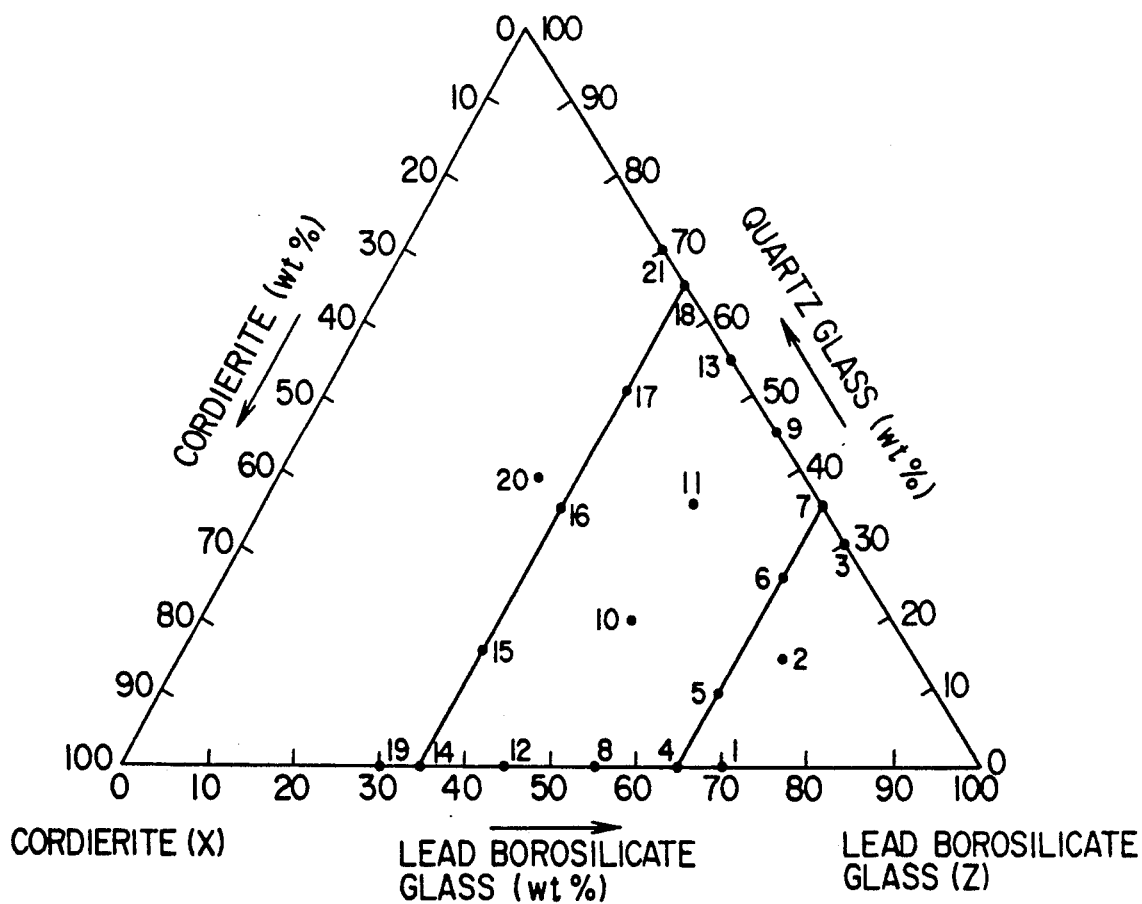
FIG. 2 is the compositional diagram shown in FIG. 1 on which compositions (or coordinates) of the materials used in Examples and Comparative Examples are plotted.

The compositions (or coordinates) of the ceramic compositions of Examples and Comparative Examples are plotted on FIG. 2. Each numerical value, 1, 2, ..., or 21 corresponds to the number appearing in the column "Compositional Ratio of Components (wt %)" in Tables 2 to 6.

As has been explained above in detail, the low temperature sintering, low dielectric inorganic composition of the present invention has a dielectric constant substantially lower than that of the conventional composition comprising alumina, glass ceramic or crystallized glass while maintaining high reliability such as an ability of being sintered at a low temperature, high insulation properties and high resistance to water as well as excellent mechanical properties such as strength. Therefore, the composition of the invention can be used for producing multilayer ceramic wiring boards for mounting very high speed VLSI elements and contributes to an increase in the packaging density and the production of fast transmitting devices.

What is claimed is:

1. An inorganic composition capable of being sintered at a low temperature and having a low dielectric constant and high mechanical strength which is a ternary inorganic composition comprising cordierite, quartz glass and lead borosilicate glass as a ceramic material wherein if the amounts of said cordierite, quartz glass and lead borosilicate glass are represented by X, Y and Z (% by weight) respectively, the composition of the ternary systems falls within the range encircled by the following four points (a) to (d) including lines between each neighboring two points but exclusive of a line between the points (c) and (d):

(X=35; Y=0; Z=65)     (a)

(X=65; Y=0; Z=35)     (b)

(X=0; Y=65; Z=35)     (c)

(X=0; Y=35; Z=65)     (d).

2. The inorganic composition of claim 1 wherein a principal component of said lead borosilicate glass comprises 50 to 75% by weight of silicon oxide, 1 to 30% by weight of boron oxide, 1 to 30% by weight of lead oxide, 0.1 to 5% by weight of oxides of Group I elements, 0.1 to 15% by weight of oxides of Group II elements, 0.1 to 1% by weight of titanium oxide and 0.1 to 1% by weight of zirconium oxide, provided that these components are selected so that the sum of the amounts of these components is equal to 100% by weight, if the components are expressed in terms of reduced amounts of oxides thereof.

3. An inorganic composition capable of being sintered at a low temperature and having a low dielectric constant and high mechanical strength which is a ternary inorganic composition comprising cordierite, quartz glass and lead borosilicate glass as a ceramic material wherein if the amounts of said cordierite, quartz glass and lead borosilicate glass are represented by X, Y and Z (% by weight) respectively, the composition of the ternary systems falls within the range encircled by the following four points (a) to (d) including lines between each neighboring two points but exclusive of a line between the points (c) and (d):

(X=35; Y=0; Z=65)     (a)

(X=65; Y=0; Z=35)     (b)

(X=0; Y=65; Z=35)     (c)

(X=0; Y=35; Z=65)     (d)

and a principal component of said lead borosilicate glass comprises 50 to 75% by weight of silicon oxide, 1 to 30% by weight of boron oxide, 1 to 30% by weight of lead oxide, 0.1 to 5% by weight of oxides of Group I elements, 0.1 to 1% by weight of titanium oxide and 0.1 to 1% by weight of zirconium oxide, provided that these components are selected so that the sum of the amounts of these components is equal to 100% by weight, if the components are expressed in terms of reduced amounts of oxides thereof.

4. The inorganic composition of claim 1, having a dielectric constant ranging from 4.32 to 5.62.

5. The inorganic composition of claim 1, having an insulation resistance of at least $10^{13}$ Ω·cm.

6. The inorganic composition of claim 1, having a bending strength of at least 1350 kg/cm².

7. The inorganic composition of claim 1, having a dielectric constant ranging from 4.37 to 5.87.

8. The inorganic composition of claim 1, having a bending strength of at least 1300 kg/cm².

9. The inorganic composition of claim 3, having a dielectric constant ranging from 4.32 to 5.62.

10. The inorganic composition of claim 3, having an insulation resistance of at least $10^{13}$ Ω·cm.

11. The inorganic composition of claim 3, having a bending strength of at least 1350 kg/cm².

12. The inorganic composition of claim 3, having a dielectric constant ranging from 4.37 to 5.87.

13. The inorganic composition of claim 3, having a bending strength of at least 1300 kg/cm².

* * * * *